(12) United States Patent
Takata

(10) Patent No.: US 9,998,098 B2
(45) Date of Patent: Jun. 12, 2018

(54) BAND PASS FILTER AND DUPLEXER

(71) Applicant: Murata Manufacturing Co., Ltd., Nagaokakyo-shi, Kyoto-fu (JP)

(72) Inventor: Toshiaki Takata, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 126 days.

(21) Appl. No.: 15/290,079

(22) Filed: Oct. 11, 2016

(65) Prior Publication Data

US 2017/0117873 A1  Apr. 27, 2017

(30) Foreign Application Priority Data

Oct. 26, 2015  (JP) ................................ 2015-209580

(51) Int. Cl.
*H03H 9/64* (2006.01)
*H03H 9/72* (2006.01)
(Continued)

(52) U.S. Cl.
CPC .......... *H03H 9/725* (2013.01); *H03H 9/0576* (2013.01); *H03H 9/6433* (2013.01);
(Continued)

(58) Field of Classification Search
CPC .......... H03H 9/0576; H03H 9/54; H03H 9/64; H03H 9/6406; H03H 9/6423;
(Continued)

(56) References Cited

U.S. PATENT DOCUMENTS 5,521,453 A * 5/1996 Yatsuda ............... H03H 9/1455
310/313 R
6,967,427 B2 * 11/2005 Yata ..................... H03H 9/0042
310/313 B (Continued)

FOREIGN PATENT DOCUMENTS

JP      2010-062873 A  *  3/2010
WO      2011/061904 A1    5/2011
WO   WO 2016/013330 A1 *  1/2016
WO   WO 2017/208856 A1 * 12/2017

OTHER PUBLICATIONS

English language machine translation of JP 2010-062873, dated Mar. 18, 2010, 9 pages.*

*Primary Examiner* — Barbara Summons
(74) *Attorney, Agent, or Firm* — Keating & Bennett, LLP

(57) ABSTRACT

A band pass filter includes a longitudinally coupled resonator elastic wave filter on a piezoelectric substrate and parallel arm resonators at parallel arms, each connected between a series arm connecting an antenna terminal and a receiving terminal and one of ground terminals. The parallel arm resonators include a first parallel arm resonator having the highest resonance frequency among the parallel arm resonators and a second parallel arm resonator. A second ground terminal that is one of the ground terminals connected to the second parallel arm resonator and a third ground terminal that is one of the ground terminals connected to the longitudinally coupled resonator elastic wave filter are connected to each other. A first ground terminal that is one of the ground terminals connected to the first parallel arm resonator is not connected to the second or third ground terminals.

20 Claims, 11 Drawing Sheets

(51) Int. Cl.
  *H03H 9/70*  (2006.01)
  *H03H 9/05*  (2006.01)
  *H03H 9/54*  (2006.01)

(52) U.S. Cl.
  CPC ........ *H03H 9/6476* (2013.01); *H03H 9/6483* (2013.01); *H03H 9/6493* (2013.01); *H03H 9/70* (2013.01); *H03H 9/54* (2013.01)

(58) Field of Classification Search
  CPC .... H03H 9/6433; H03H 9/6436; H03H 9/644; H03H 9/6476; H03H 9/6483; H03H 9/6493; H03H 9/70; H03H 9/725
  USPC .......................................... 333/133, 193, 195
  See application file for complete search history.

(56) References Cited

U.S. PATENT DOCUMENTS

| | | | | |
|---|---|---|---|---|
| 8,179,211 | B2 * | 5/2012 | Bauer | H03H 9/0542 |
| | | | | 333/193 |
| 8,319,585 | B2 * | 11/2012 | Miyake | H03H 9/6436 |
| | | | | 333/193 |
| 8,410,869 | B2 * | 4/2013 | Omote | H03H 9/6433 |
| | | | | 310/313 B |
| 2012/0313724 | A1 | 12/2012 | Tsurunari et al. | |
| 2013/0314173 | A1 * | 11/2013 | Inoue | H03H 9/70 |
| | | | | 333/133 |
| 2014/0176257 | A1 * | 6/2014 | Takamine | H03H 9/0576 |
| | | | | 333/133 |

* cited by examiner

BAND PASS FILTER AND DUPLEXER

CROSS REFERENCE TO RELATED APPLICATIONS

This application claims the benefit of priority to Japanese Patent Application 2015-209580, filed Oct. 26, 2015, the entire contents of which is incorporated by reference herein.

BACKGROUND OF THE INVENTION

1. Field of the Invention

The present invention relates to a band pass filter and a duplexer.

2. Description of the Related Art

Band pass filters and duplexers are widely used in, for example, cellular phones.

In an elastic wave filter apparatus disclosed in International Publication No. WO 2011/061904, a ladder filter and a longitudinally coupled resonator elastic wave filter are connected in series to each other. The ladder filter includes a plurality of parallel arm resonators. All of the parallel arm resonators in the ladder filter are connected in common to a ground electrode connected to a ground potential. The longitudinally coupled resonator elastic wave filter is connected to a ground electrode different from the ground electrode to which the above-described parallel arm resonators are connected.

In the elastic wave filter apparatus disclosed in International Publication No. WO 2011/061904, since all of the parallel arm resonators in the ladder filter are connected in common to the ground electrode, they are susceptible to a parasitic inductance. Accordingly, the resonance frequencies of the parallel arm resonators sometimes become low. It is therefore impossible to sufficiently increase the steepness on a lower-frequency side of a passband of the elastic wave filter apparatus.

In addition, in the longitudinally coupled resonator elastic wave filter, it is sometimes impossible to make the potential of an electrode connected to the ground electrode sufficiently close to a ground potential. This leads to the degradation of isolation characteristics.

SUMMARY OF THE INVENTION

Preferred embodiments of the present invention provide a band pass filter capable of increasing steepness on a lower-frequency side of the passband of the band pass filter, and increasing the amount of attenuation outside the passband of the band pass filter, and provide a duplexer having excellent isolation characteristics.

A band pass filter according to a preferred embodiment of the present invention includes a piezoelectric substrate, a first terminal provided on the piezoelectric substrate, a second terminal provided on the piezoelectric substrate, a longitudinally coupled resonator elastic wave filter that is connected to the first terminal and is provided on the piezoelectric substrate, a plurality of ground terminals that are provided on the piezoelectric substrate and are connected to a ground potential, and a plurality of parallel arm resonators provided at a plurality of parallel arms each connected between a series arm connecting the first terminal and the second terminal and one of the ground terminals. The parallel arm resonators include a first parallel arm resonator having the highest resonance frequency among the parallel arm resonators and a second parallel arm resonator other than the first parallel arm resonator. The ground terminals include a first ground terminal connected to the first parallel arm resonator, a second ground terminal connected to the second parallel arm resonator, and a third ground terminal connected to the longitudinally coupled resonator elastic wave filter. The second ground terminal and the third ground terminal are connected to each other on the piezoelectric substrate, and the first ground terminal is not connected to the second ground terminal or the third ground terminal on the piezoelectric substrate.

In a preferred embodiment of the band pass filter, the band pass filter further includes a series arm resonator that is provided at the series arm and is connected between one of the first terminal and the second terminal and the longitudinally coupled resonator elastic wave filter. In this example, the amount of attenuation outside the passband of the band pass filter is further increased.

In a preferred embodiment of the band pass filter, the series arm resonator is provided between the first parallel arm resonator and the second parallel arm resonator, and the first parallel arm resonator, the second parallel arm resonator, and the series arm resonator define a ladder filter. In this case, the amount of attenuation outside the passband of the band pass filter is further increased.

In a preferred embodiment of the band pass filter, one of the first parallel arm resonator and the second parallel arm resonator is connected between the first terminal and one of the ground terminals and the other one of the first parallel arm resonator and the second parallel arm resonator is connected between the second terminal and one of the ground terminals. In this case, the amount of attenuation outside the passband of the band pass filter is further increased.

In a preferred embodiment of the band pass filter, a capacitance of the first parallel arm resonator is smaller than that of the second parallel arm resonator. In this case, the degradation in an insertion loss rarely occurs.

In a preferred embodiment of the band pass filter, the second parallel arm resonator is one of a plurality of second parallel arm resonators, the second parallel arm resonators are a plurality of divided parallel arm resonators, and a resonance frequency of at least one of the divided parallel arm resonators is different from that of one of the other divided parallel arm resonators. In this case, the amount of attenuation outside the passband of the band pass filter is increased in a wide frequency range.

A duplexer according to a preferred embodiment of the present invention includes a first band pass filter that is a band pass filter according to a preferred embodiment of the present invention and a second band pass filter that is provided on the piezoelectric substrate and has a passband different from that of the first band pass filter.

In a preferred embodiment of the duplexer, the duplexer further includes a fourth ground terminal that is connected to the second band pass filter and a ground potential and is not connected to the first ground terminal, the second ground terminal, or the third ground terminal on the piezoelectric substrate. In this case, isolation characteristics are further improved.

In a preferred embodiment of the duplexer, the first band pass filter is a reception filter and the second band pass filter is a transmission filter.

A band pass filter according to a preferred embodiment of the present invention increases steepness on a lower-frequency side of the passband of the band pass filter and the amount of attenuation outside the passband of the band pass filter. A duplexer according to a preferred embodiment of the present invention increases steepness on a lower-frequency side of the passband of a band pass filter and provide excellent isolation characteristics.

The above and other elements, features, steps, characteristics and advantages of the preferred embodiments of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings.

The preferred embodiments are merely illustrative, and components according to different preferred embodiments may be partially exchanged or combined.

Figure 1:
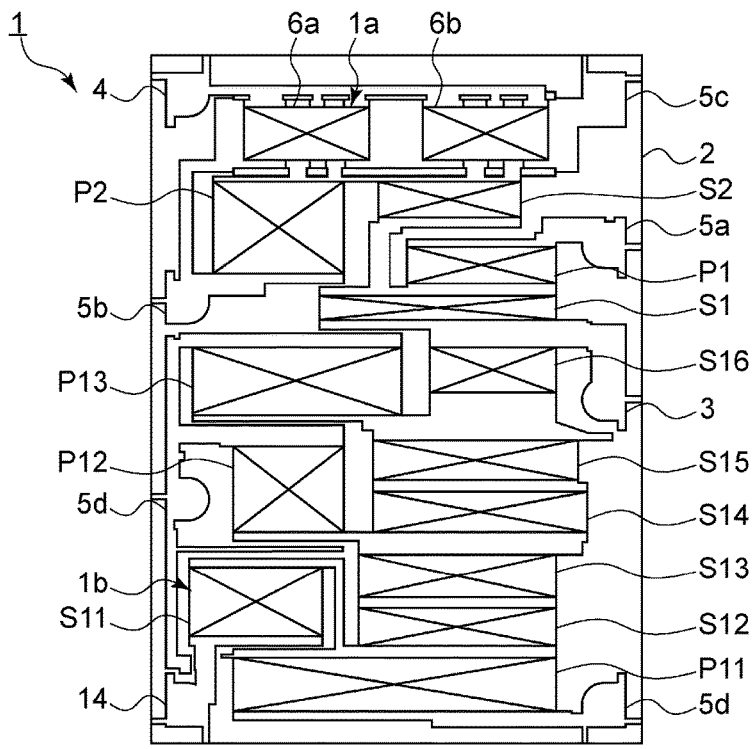
FIG. 1 is a schematic plan view illustrating an electrode structure of a duplexer according to a first preferred embodiment of the present invention.
Figure 2:
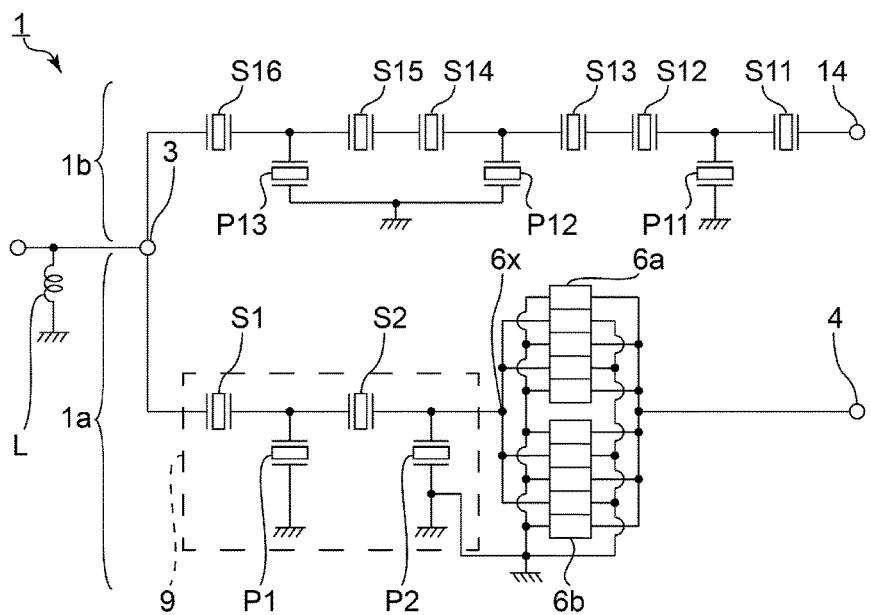
FIG. 2 is a circuit diagram of a duplexer according to the first preferred embodiment of the present invention.

FIG. 1 is a schematic plan view illustrating an electrode structure of a duplexer according to the first preferred embodiment of the present invention. FIG. 2 is a circuit diagram of a duplexer according to the first preferred embodiment.

As illustrated in FIG. 1, a duplexer 1 includes a piezoelectric substrate 2. The piezoelectric substrate 2 is made of $LiNbO_3$, for example, but may be made of piezoelectric monocrystal such as $LiTaO_3$ or piezoelectric ceramic.

The duplexer 1 includes a first band pass filter 1a and a second band pass filter 1b which are provided on the piezoelectric substrate 2. The passband of the second band pass filter 1b is different from that of the first band pass filter 1a. For example, the first band pass filter 1a is a receiver filter having a passband of about 925 MHz to about 960 MHz. The second band pass filter 1b is a transmission filter having a passband of about 880 MHz to about 915 MHz. The passbands of the first band pass filter 1a and the second band pass filter 1b are not limited to these passbands. The first band pass filter 1a may be a transmission filter, and the second band pass filter 1b may be a receiver filter.

The first band pass filter 1a is a band pass filter according to a preferred embodiment of the present invention.

On the piezoelectric substrate 2, an antenna terminal 3 that is a first terminal connected to an antenna is provided. In the first band pass filter 1a of a receiver filter circuit, the antenna terminal 3 functions as an input terminal. On the other hand, in the second band pass filter 1b of a transmission filter circuit, a first terminal that is the antenna terminal 3 functions as an output terminal.

The first band pass filter 1a of a receiver filter circuit is provided on the piezoelectric substrate 2. In a case where the first band pass filter 1a functions as a receiver filter, a receiving terminal 4 that is a second terminal and first to third ground terminals 5a to 5c connected to a ground potential are provided on the piezoelectric substrate 2. The second ground terminal 5b and the third ground terminal 5c are electrically connected to each other on the piezoelectric substrate 2. On the other hand, the first ground terminal 5a is electrically insulated from or not connected to the second ground terminal 5b or the third ground terminal 5c on the piezoelectric substrate 2.

The first band pass filter 1a includes a first longitudinally coupled resonator elastic wave filter 6a, a second longitudinally coupled resonator elastic wave filter 6b, and a ladder filter. The first longitudinally coupled resonator elastic wave filter 6a, the second longitudinally coupled resonator elastic wave filter 6b, and the ladder filter are provided on the piezoelectric substrate 2. The first band pass filter 1a includes two longitudinally coupled resonator elastic wave filters, but may include only one longitudinally coupled resonator elastic wave filter or more than two longitudinally coupled resonator elastic wave filters.

The second band pass filter 1b is a ladder filter provided on the piezoelectric substrate 2. The configuration of the second band pass filter 1b will be described in detail later.

Referring to FIG. 1, the first longitudinally coupled resonator elastic wave filter 6a, the second longitudinally coupled resonator elastic wave filter 6b, and additional elastic wave resonators are schematically illustrated by rectangles in which two diagonals are drawn. In FIGS. 4, 8, 12, and 18, these components are similarly illustrated.

As illustrated in FIG. 2, the first longitudinally coupled resonator elastic wave filter 6a and the second longitudinally coupled resonator elastic wave filter 6b in the first band pass filter 1a are connected in parallel to each other between a ladder filter 9 represented by a broken line, and the receiving terminal 4.

The ladder filter 9 includes a plurality of series arm resonators S1 and S2 connected in series to each other. The series arm resonators S1 and S2 are located at a series arm connected between the receiving terminal 4 and the antenna terminal 3. For example, the series arm resonators S1 and S2 are connected between the antenna terminal 3 and a connection point 6x between the first longitudinally coupled resonator elastic wave filter 6a and the second longitudinally coupled resonator elastic wave filter 6b. The ladder filter 9 may include at least one series arm resonator.

The ladder filter 9 includes a first parallel arm resonator P1 and a second parallel arm resonator P2. The first parallel arm resonator P1 and the second parallel arm resonator P2 are located at respective parallel arms connected between a series arm and a ground potential. For example, the first parallel arm resonator P1 is connected between a ground potential and a connection point between the series arm resonators S1 and S2. The second parallel arm resonator P2 is connected between a ground potential and a connection point between the series arm resonator S2 and the connection point 6x.

The first parallel arm resonator P1 has the highest resonance frequency and the smallest capacitance of a plurality of parallel arm resonators. For example, the first parallel arm resonator P1 has the resonance frequency of about 916 MHz and the capacitance of about 1.95 pF. The second parallel arm resonator P2 has the resonance frequency of about 911 MHz and the capacitance of about 5.08 pF.

The detailed configuration of a longitudinally coupled resonator elastic wave filter according to this preferred embodiment will be described using the first longitudinally coupled resonator elastic wave filter 6a as an example.

Figure 3:
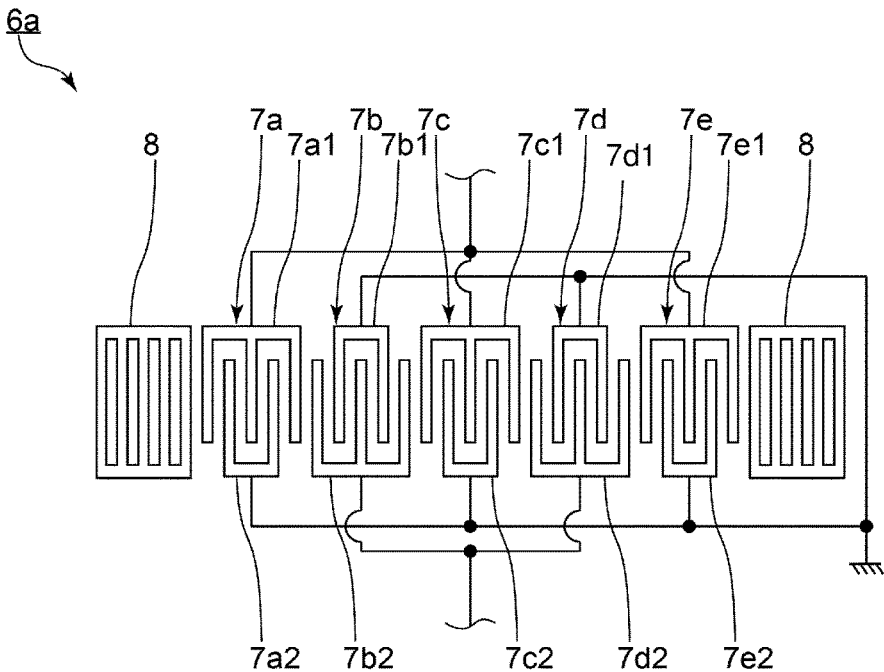
FIG. 3 is an enlarged plan view describing the configuration of a first longitudinally coupled resonator elastic wave filter according to the first preferred embodiment of the present invention.

FIG. 3 is an enlarged plan view describing the configuration of a first longitudinally coupled resonator elastic wave filter according to the first preferred embodiment.

The first longitudinally coupled resonator elastic wave filter 6a includes a first IDT electrode 7a to a fifth IDT electrode 7e. The first IDT electrode 7a includes a pair of comb-shaped electrodes 7a1 and 7a2. Each of the comb-shaped electrodes 7a1 and 7a2 includes a bus bar and a plurality of electrode fingers having first ends connected to the bus bar. The electrode fingers of the comb-shaped electrode 7a1 and the electrode fingers of the comb-shaped electrode 7a2 interdigitate with one another. The second IDT electrode 7b similarly includes comb-shaped electrodes 7b1 and 7b2, the third IDT electrode 7c similarly includes comb-shaped electrodes 7c1 and 7c2, the fourth IDT electrode 7d similarly includes comb-shaped electrodes 7d1 and 7d2, and the fifth IDT electrode 7e similarly includes comb-shaped electrodes 7e1 and 7e2.

Reflectors 8 are disposed on both sides of a region where the first IDT electrode 7a to the fifth IDT electrode 7e are located in an elastic wave propagation direction.

The first IDT electrode 7a to the fifth IDT electrode 7e are formed as a laminate obtained, for example, by laminating an NiCr layer, a Pt layer, a Ti layer, and an AlCu layer in this order from the side of a piezoelectric substrate. The materials of the first IDT electrode 7a to the fifth IDT electrode 7e are not limited to the above-described materials and may be made of other materials. The laminate with the first IDT electrode 7a to the fifth IDT electrode 7e may include any number of layers, and could include a single layer. The reflectors 8 may be made of the same materials as the first IDT electrode 7a to the fifth IDT electrode 7e.

The comb-shaped electrode 7a1 of the first IDT electrode 7a, the comb-shaped electrode 7c1 of the third IDT electrode 7c, and the comb-shaped electrode 7e1 of the fifth IDT electrode 7e are connected to the receiving terminal 4 illustrated in FIG. 2. The comb-shaped electrode 7b2 of the second IDT electrode 7b and the fourth comb-shaped electrode 7d2 of the fourth IDT electrode 7d are connected to the ladder filter 9 illustrated in FIG. 2. The comb-shaped electrode 7a2 of the first IDT electrode 7a, the comb-shaped electrode 7b1 of the second IDT electrode 7b, the comb-shaped electrode 7c2 of the third IDT electrode 7c, the comb-shaped electrode 7d1 of the fourth IDT electrode 7d, and the comb-shaped electrode 7e2 of the fifth IDT electrode 7e are connected in common to a ground potential.

The second longitudinally coupled resonator elastic wave filter preferably has the same or substantially the same configuration as the first longitudinally coupled resonator elastic wave filter 6a. In this preferred embodiment, each of the first parallel arm resonator P1, the second parallel arm resonator P2, and a plurality of series arm resonators include an IDT electrode.

Referring back to FIG. 1, the first longitudinally coupled resonator elastic wave filter 6a and the second longitudinally coupled resonator elastic wave filter 6b are connected in common to the third ground terminal 5c. The first parallel arm resonator P1 is connected to the first ground terminal 5a. The second parallel arm resonator P2 is connected to the second ground terminal 5b.

The duplexer 1 has a Wafer Level Package (WLP) structure. A frame support is provided on the piezoelectric substrate 2. The frame support surrounds a region where the first band pass filter 1a and the second band pass filter 1b are located. A cover is provided on the frame support. A hollow portion is surrounded by the piezoelectric substrate 2, the frame support, and the cover. The duplexer 1 may include another structure other than a WLP structure, for example, a CSP structure.

In this preferred embodiment, the second ground terminal 5b and the third ground terminal 5c are connected to each other on the piezoelectric substrate 2 and the first ground terminal 5a is not connected to the second ground terminal 5b and the third ground terminal 5c on the piezoelectric substrate 2. As a result, in the duplexer 1, the steepness on a lower-frequency side of a passband of the first band pass filter 1a is increased. Furthermore, the amount of attenuation outside the passband of the first band pass filter 1a is increased, and the isolation characteristics of the duplexer 1 are improved. This will be described below. The detailed configuration of the second band pass filter 1b will also be described below.

As used herein, high steepness means that the amount of change in frequency is small with respect to a certain amount of change in attenuation around an end portion of a passband. For example, around the end portion of a passband, the smaller the difference between a frequency at which an attenuation is about 3 dB and a frequency at which an attenuation is about 50 dB, the higher the steepness.

As illustrated in FIG. 1, the second band pass filter 1*b* includes a transmission terminal 14 and a plurality of fourth ground terminals 5*d*, on the piezoelectric substrate 2, connected to a ground potential. As described previously, the second band pass filter 1*b* is a ladder filter defining and functioning as a transmission filter circuit. Parallel arm resonators P11 to P13 in the second band pass filter 1*b* are connected to the respective fourth ground terminals 5*d*.

As illustrated in FIG. 2, between the transmission terminal 14 and the antenna terminal 3, series arm resonator S11 to S16 are connected in series to one another. The parallel arm resonator P11 is connected between a connection point between the series arm resonators S11 and S12 and a ground potential. The parallel arm resonator P12 is connected between a connection point between the series arm resonators S13 and S14 and a ground potential. The parallel arm resonator P13 is connected between a connection point between the series arm resonators S15 and S16 and a ground potential.

As illustrated in FIG. 1, the parallel arm resonators P12 and P13 are connected in common to the same fourth ground terminal 5*d*. The fourth ground terminals 5*d* are not connected to the first ground terminal 5*a*, the second ground terminal 5*b*, or the third ground terminal 5*c* on the piezoelectric substrate 2. The second band pass filter 1*b* may include any electrode structure.

As illustrated in FIG. 2, an inductor L may be used to adjust impedance. The inductor L is connected between the antenna terminal 3 and a ground potential. The inductor L is provided on a substrate other than the piezoelectric substrate 2.

The effect of the first preferred embodiment will be described in more detail by comparing the first preferred embodiment with first to third comparative examples to be described later.

Figure 4:
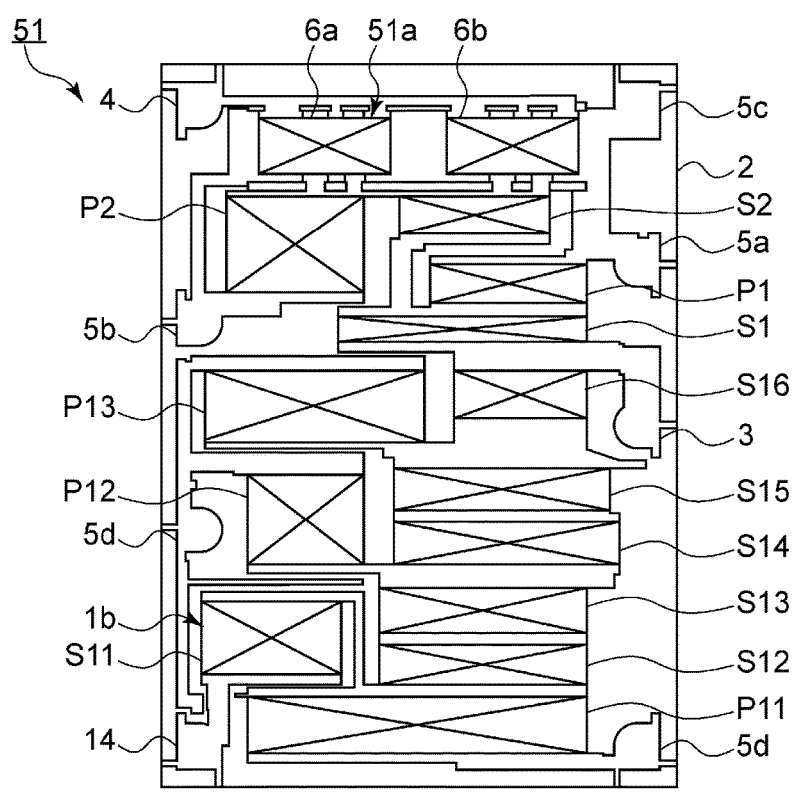
FIG. 4 is a schematic plan view illustrating an electrode structure of a duplexer of a first comparative example.
Figure 5:
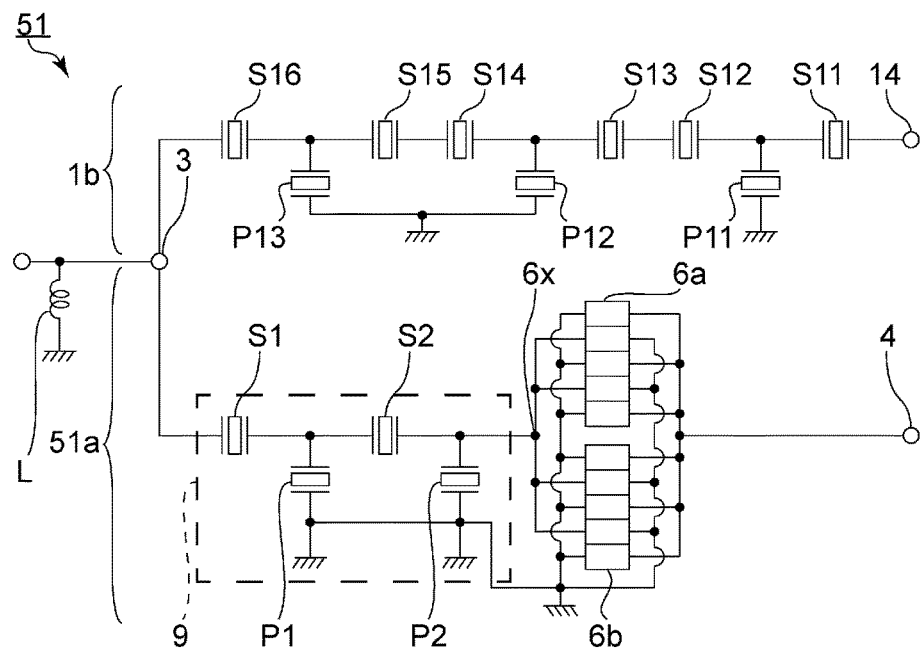
FIG. 5 is a circuit diagram of a duplexer of the first comparative example.

FIG. 4 is a schematic plan view illustrating an electrode structure of a duplexer of a first comparative example. FIG. 5 is a circuit diagram of a duplexer of the first comparative example.

As illustrated in FIG. 5, the duplexer 51 differs from a duplexer according to the first preferred embodiment in that the first parallel arm resonator P1, the second parallel arm resonator P2, the first longitudinally coupled resonator elastic wave filter 6*a*, and the second longitudinally coupled resonator elastic wave filter 6*b* are connected in common to a ground potential in a first band pass filter 51*a*. As illustrated in FIG. 4, the first ground terminal 5*a* is connected to the second ground terminal 5*b* and the third ground terminal 5*c*.

Figure 6:
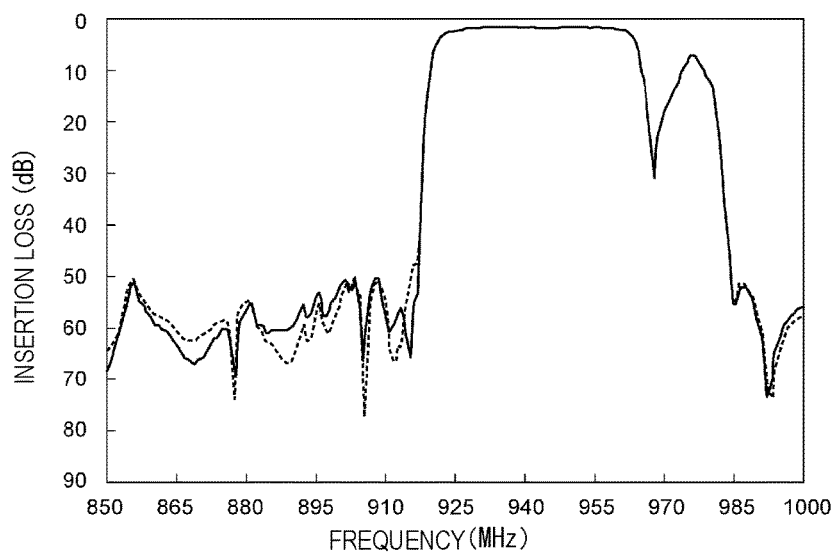
FIG. 6 is a diagram illustrating attenuation frequency characteristics of a first band pass filter according to the first preferred embodiment of the present invention and a first band pass filter of a first comparative example.
Figure 7:
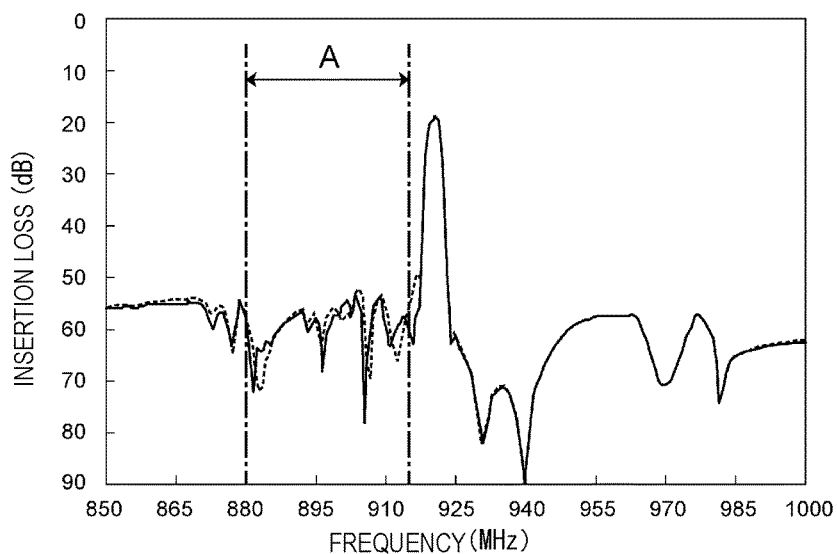
FIG. 7 is a diagram illustrating isolation characteristics of a duplexer according to the first preferred embodiment of the present invention and a duplexer of the first comparative example.

FIG. 6 is a diagram illustrating attenuation frequency characteristics of a first band pass filter according to the first preferred embodiment and a first band pass filter of a first comparative example. FIG. 7 is a diagram illustrating isolation characteristics of a duplexer according to the first preferred embodiment and a duplexer of the first comparative example. In FIGS. 6 and 7, a solid line represents a result of the first preferred embodiment and a broken line represents a result of the first comparative example.

In the first comparative example, steepness is low on a lower-frequency side of a passband of a first band pass filter.

In contrast, in the first preferred embodiment, steepness is high. In the first comparative example, the difference between a frequency at which attenuation is about 3 dB and a frequency at which attenuation is about 50 dB is about 6.66 MHz on a lower-frequency side of the passband. In the first preferred embodiment, the above-described frequency difference is about 5.93 MHz, for example. That is, steepness is increased.

In each of the first parallel arm resonator P1 and the second parallel arm resonator P2 illustrated in FIG. 1, the smaller the difference between a resonance frequency and an antiresonance frequency, the higher the steepness on a lower-frequency side of a passband. The first parallel arm resonator P1 and the second parallel arm resonator P2 are connected to the first ground terminal 5*a* and the second ground terminal 5*b*, respectively. The first ground terminal 5*a* and the second ground terminal 5*b* have a parasitic inductance. Under the influence of this parasitic inductance, the resonance frequency of each of the first parallel arm resonator P1 and the second parallel arm resonator P2 decreases. The difference between the resonance frequency and the antiresonance frequency of each of the first parallel arm resonator P1 and the second parallel arm resonator P2 therefore increases.

The first parallel arm resonator P1 has the highest resonance frequency of a plurality of parallel arm resonators in the first band pass filter 1*a*. Among the resonance frequencies of these parallel arm resonators, the resonance frequency of the first parallel arm resonator P1 is located closest to the passband of the first band pass filter 1*a*. Accordingly, the difference between the resonance frequency and the antiresonance frequency of the first parallel arm resonator P1 has the largest influence on the steepness on a lower-frequency side of the passband.

In the first comparative example illustrated in FIG. 4, the first ground terminal 5*a* is connected to the second ground terminal 5*b* and the third ground terminal 5*c* on the piezoelectric substrate 2. The influence of a parasitic inductance on the first parallel arm resonator P1 and the second parallel arm resonator P2 is therefore large. Since the difference between the resonance frequency and the antiresonance frequency of each of the first parallel arm resonator P1 and the second parallel arm resonator P2 becomes large, the above-described steepness is reduced.

In contrast, in the first preferred embodiment illustrated in FIG. 1, the first ground terminal 5*a* is not connected to the second ground terminal 5*b* or the third ground terminal 5*c* on the piezoelectric substrate 2. The influence of a parasitic inductance on the first parallel arm resonator P1 and the second parallel arm resonator P2 is therefore small. For example, since the first ground terminal 5*a* is not connected to another ground terminal, the influence of a parasitic inductance on the first parallel arm resonator P1 is effectively reduced. It is therefore possible to effectively increase steepness on a lower-frequency side of a passband of the first band pass filter 1*a*.

As illustrated in FIG. 7, isolation characteristics are also improved in the first preferred embodiment as compared with the first comparative example. For example, in a frequency band A that is the passband of the second band pass filter, the maximum value of attenuation is about 51.9 dB in the first comparative example and is about 53.4 dB in the first preferred embodiment, for example. Thus, in the first preferred embodiment, isolation characteristics are improved.

Figure 8:
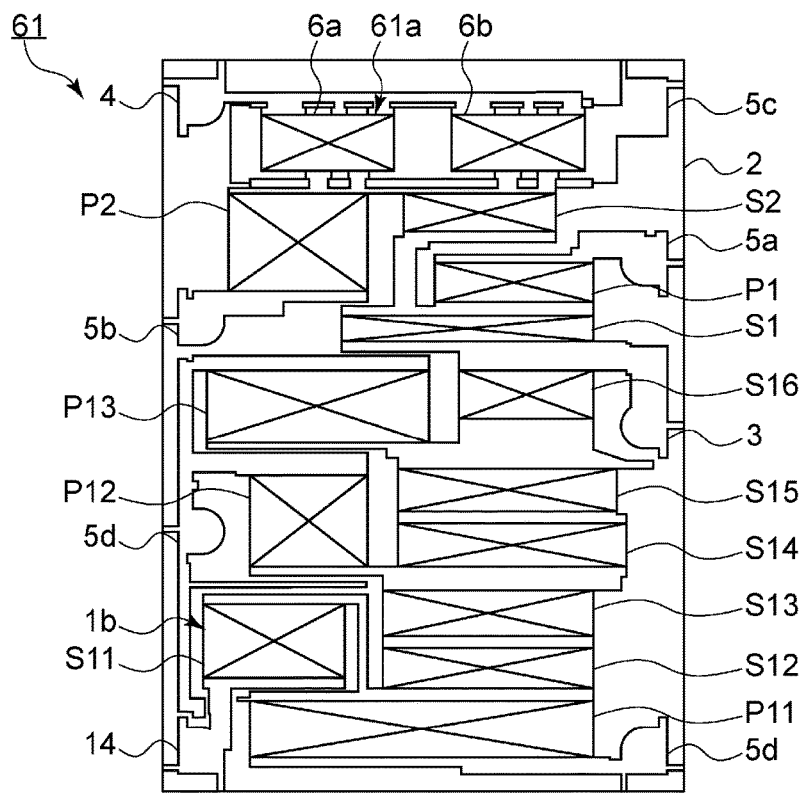
FIG. 8 is a schematic plan view illustrating the electrode structure of a duplexer of a second comparative example.
Figure 9:
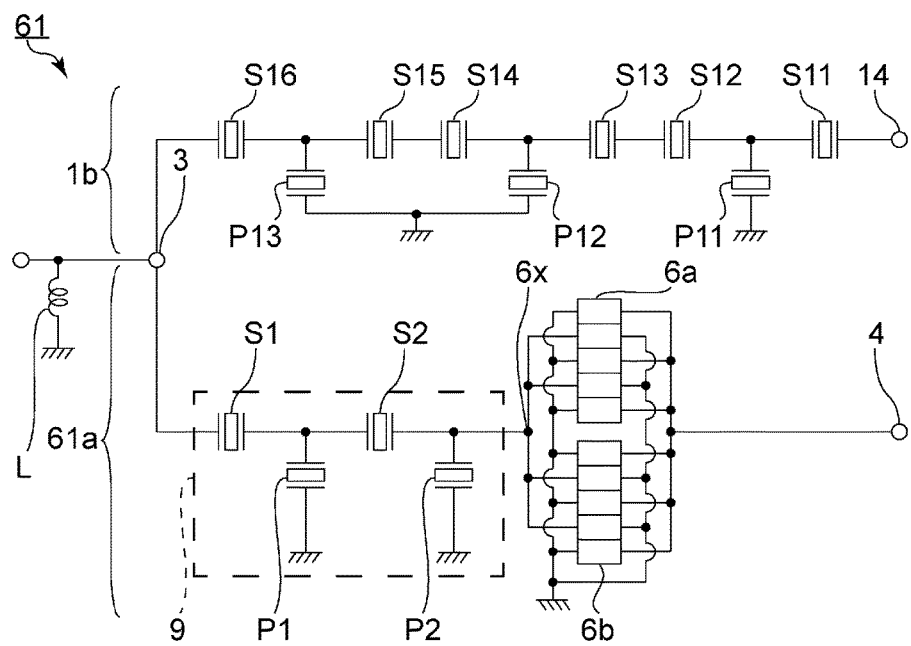
FIG. 9 is a circuit diagram of a duplexer of the second comparative example.

FIG. 8 is a schematic plan view illustrating the electrode structure of a duplexer of a second comparative example. FIG. 9 is a circuit diagram of a duplexer of the second comparative example.

As illustrated in FIG. 8, a duplexer 61 differs from a duplexer according to the first preferred embodiment in that the second ground terminal 5b and the third ground terminal 5c are not connected in a first band pass filter 61a. As illustrated in FIG. 9, the first longitudinally coupled resonator elastic wave filter 6a, the second longitudinally coupled resonator elastic wave filter 6b, and all of parallel arm resonators are not connected in common to a ground potential.

Figure 10:
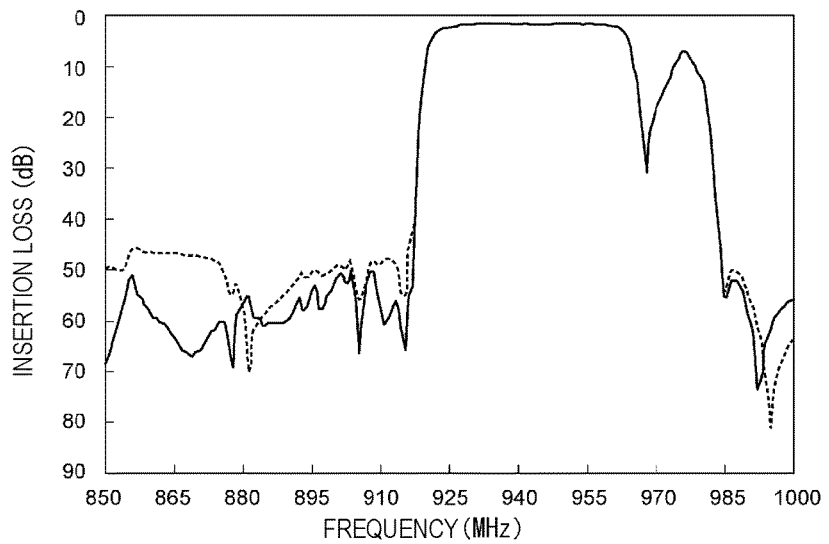
FIG. 10 is a diagram illustrating attenuation frequency characteristics of a first band pass filter according to the first preferred embodiment of the present invention and a first band pass filter of a second comparative example.
Figure 11:
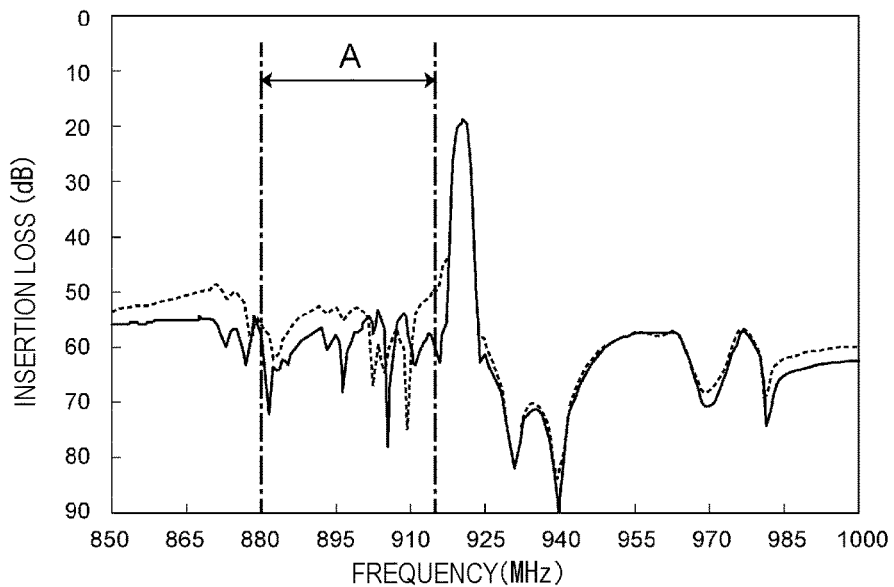
FIG. 11 is a diagram illustrating isolation characteristics of a duplexer according to the first preferred embodiment of the present invention and a duplexer of the second comparative example.

FIG. 10 is a diagram illustrating attenuation frequency characteristics of a first band pass filter according to the first preferred embodiment and a first band pass filter of a second comparative example. FIG. 11 is a diagram illustrating isolation characteristics of a duplexer according to the first preferred embodiment and a duplexer of the second comparative example. In FIGS. 10 and 11, a solid line represents a result of the first preferred embodiment and a broken line represents a result of the second comparative example.

As illustrated in FIG. 10, in the second comparative example, the difference between a frequency at which attenuation is about 3 dB and a frequency at which attenuation is about 50 dB is about 6.76 MHz. That is, the steepness on a lower-frequency side of a passband of a band pass filter according to the first preferred embodiment is higher than that of a band pass filter of the second comparative example.

As illustrated in FIG. 11, in the second comparative example, the maximum value of attenuation in the frequency band A is about 49.2 dB. In the first preferred embodiment, isolation characteristics are improved in a wide frequency range as compared with the second comparative example.

In the first band pass filter 61a of the second comparative example illustrated in FIG. 8, the third ground terminal 5c is not connected to the second ground terminal 5b. Accordingly, a parasitic inductance between each of the first longitudinally coupled resonator elastic wave filter 6a and the second longitudinally coupled resonator elastic wave filter 6b and a ground potential is large. Isolation characteristics therefore degrade in a wide frequency range.

In contrast, in the first preferred embodiment illustrated in FIG. 1, the third ground terminal 5c is connected to the second ground terminal 5b. The number of connection paths from each of the first longitudinally coupled resonator elastic wave filter 6a and the second longitudinally coupled resonator elastic wave filter 6b to a ground potential are increased. A parasitic inductance between each of the first longitudinally coupled resonator elastic wave filter 6a and the second longitudinally coupled resonator elastic wave filter 6b and a ground potential is reduced. It is therefore possible to increase the amount of attenuation outside the passband of the first band pass filter 1a. Furthermore, as illustrated in FIG. 11, since an attenuation is increased in the frequency band A, the isolation characteristics of the duplexer 1 are improved.

Figure 12:
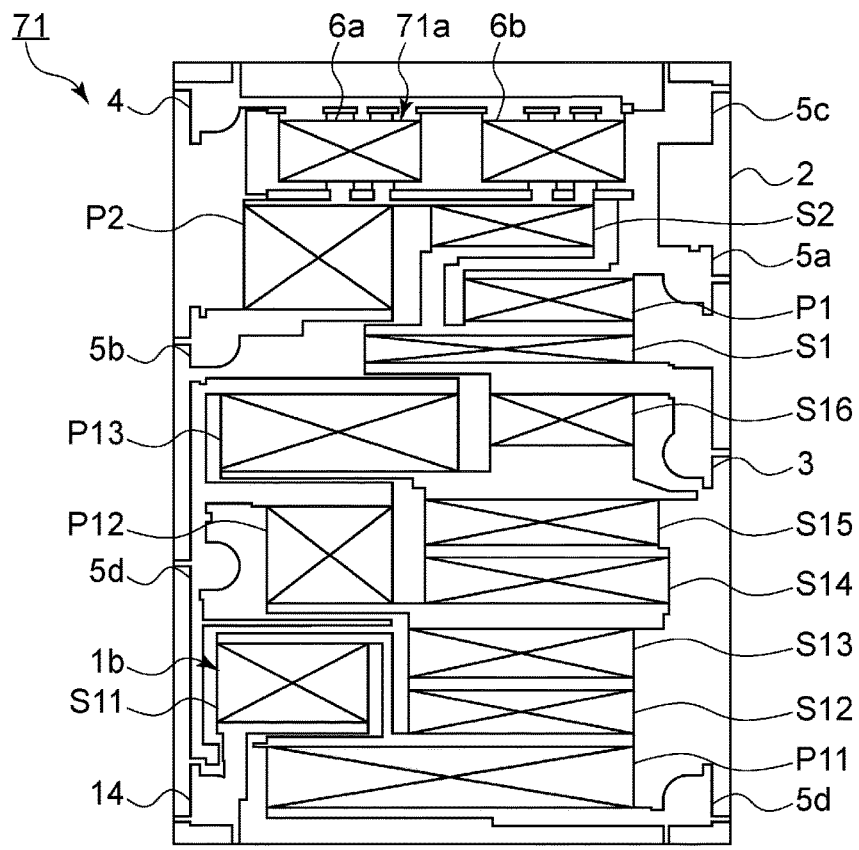
FIG. 12 is a schematic plan view illustrating an electrode structure of a duplexer of a third comparative example.
Figure 13:
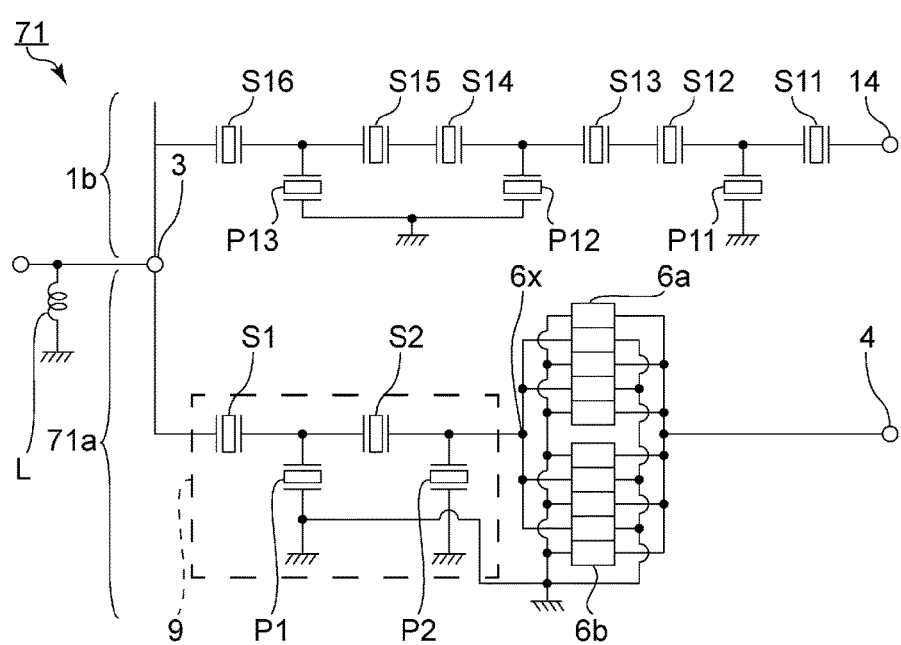
FIG. 13 is a circuit diagram of a duplexer of the third comparative example.

FIG. 12 is a schematic plan view illustrating an electrode structure of a duplexer of a third comparative example. FIG. 13 is a circuit diagram of a duplexer of the third comparative example.

As illustrated in FIG. 12, a duplexer 71 differs from a duplexer according to the first preferred embodiment in that the second ground terminal 5b and the third ground terminal 5c are not connected to each other and the first ground terminal 5a is connected to the third ground terminal 5c in a first band pass filter 71a. As illustrated in FIG. 13, in the third comparative example, the first parallel arm resonator P1, the first longitudinally coupled resonator elastic wave filter 6a, and the second longitudinally coupled resonator elastic wave filter 6b are connected in common to a ground potential.

Figure 14:
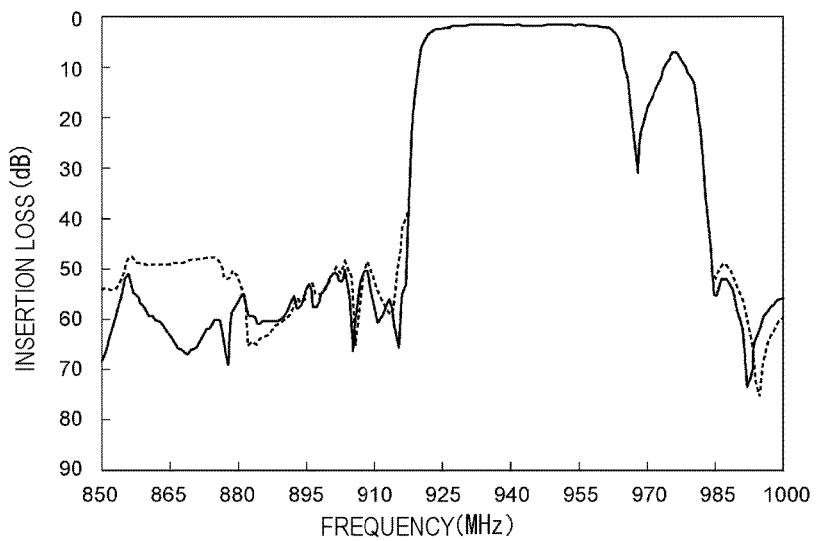
FIG. 14 is a diagram illustrating attenuation frequency characteristics of a first band pass filter according to the first preferred embodiment of the present invention and a first band pass filter of a third comparative example.
Figure 15:
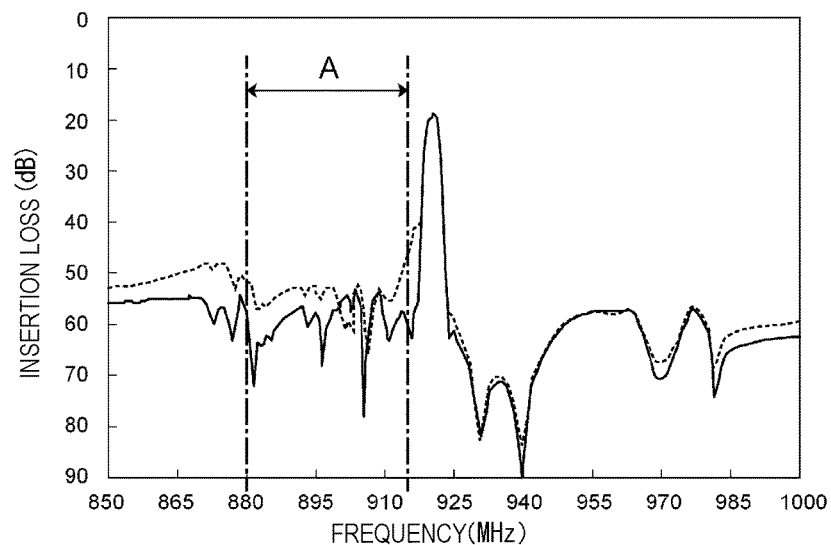
FIG. 15 is a diagram illustrating isolation characteristics of a duplexer according to the first preferred embodiment of the present invention and a duplexer of the third comparative example.

FIG. 14 is a diagram illustrating attenuation frequency characteristics of a first band pass filter according to the first preferred embodiment and a first band pass filter of a third comparative example. FIG. 15 is a diagram illustrating isolation characteristics of a duplexer according to the first preferred embodiment and a duplexer of the third comparative example. In FIGS. 14 and 15, a solid line represents a result of the first preferred embodiment and a broken line represents a result of the third comparative example.

As illustrated in FIG. 14, in the third comparative example, the difference between a frequency at which attenuation is about 3 dB and a frequency at which attenuation is about 50 dB is about 7.50 MHz. As illustrated in FIG. 15, in the third comparative example, the maximum value of an attenuation in the frequency band A is about 47.0 dB. The steepness on a lower-frequency side of a passband of a first band pass filter according to the first preferred embodiment is therefore higher than that of a first band pass filter of the third comparative example. Furthermore, the isolation characteristics of a duplexer according to the first preferred embodiment are improved over those of a duplexer of the third comparative example.

As described previously, among a plurality of parallel arm resonators in a band pass filter, the first parallel arm resonator has the largest influence on the above-described steepness. In the third comparative example illustrated in FIG. 12, the first ground terminal 5a connected to the first parallel arm resonator P1 is connected to the third ground terminal 5c. Accordingly, the influence of a parasitic inductance on the first parallel arm resonator P1 is large and the above-described steepness is degraded.

In contrast, in the first preferred embodiment illustrated in FIG. 1, the first ground terminal 5a is not connected to the third ground terminal 5c. Furthermore, the second ground terminal 5b connected to the second parallel arm resonator P2 which has a comparatively small influence on the above-described steepness is connected to the third ground terminal 5c. It is therefore possible to increase the steepness on a lower-frequency side of a passband of the first band pass filter 1a and improve the isolation characteristics of the duplexer 1.

Like in the first preferred embodiment, it is desirable that the first parallel arm resonator P1 have the smallest capacitance of a plurality of parallel arm resonators in the first band pass filter 1a. The influence of a parasitic inductance on the first parallel arm resonator P1 is therefore further reduced. As a result, the above-described steepness is further increased.

By reducing the capacitance of the first parallel arm resonator P1, a current flowing from the first parallel arm resonator P1 to a ground potential is reduced. Among a plurality of parallel arm resonators, the first parallel arm resonator P1 has a resonance frequency located closest to the passband of the first band pass filter 1a. Since the above-described current flowing from the first parallel arm resonator P1 to a ground potential is small, the degradation in an insertion loss rarely occurs.

In order to reduce the area of the first parallel arm resonator P1, it is desirable that the intersecting width of IDT electrodes be reduced. Alternatively, the number of pairs of IDT electrodes in the first parallel arm resonator P1 may be reduced to reduce the area of the first parallel arm resonator P1. There are methods of reducing the capacitance of the first parallel arm resonator P1 to a certain capacitance by reducing the number of pairs of IDT electrodes and methods of reducing the capacitance of the first parallel arm resonator P1 to the certain capacitance by reducing the intersecting width of IDT electrodes which is more effective in significantly reducing or suppressing the reduction in the Q value of the first parallel arm resonator P1.

In the first preferred embodiment, between the first parallel arm resonator P1 and the second parallel arm resonator P2, the series arm resonator S2 is located. As a result, the amount of attenuation outside the passband of the first band pass filter 1a is effectively increased.

Figure 16:
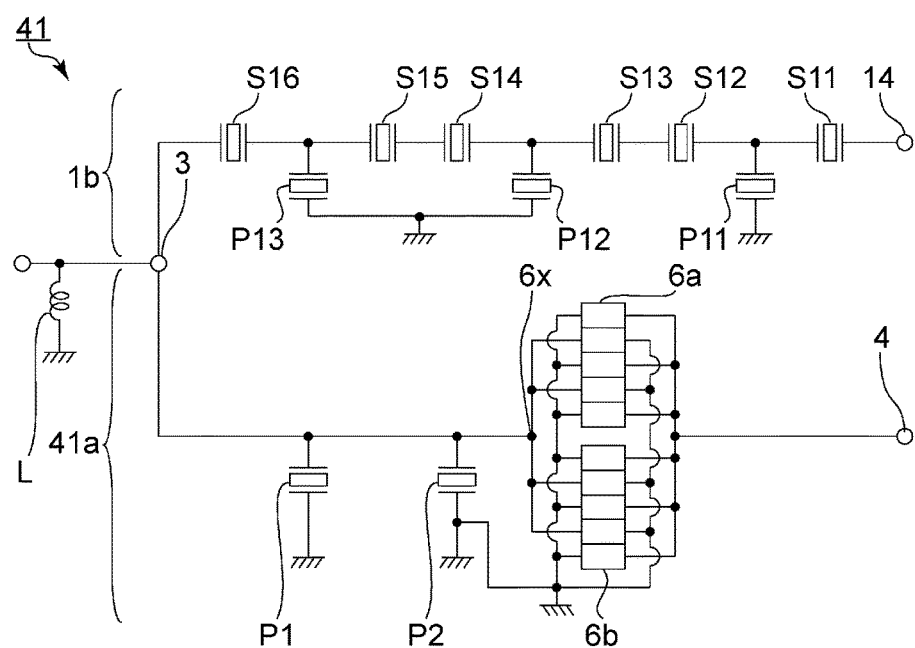
FIG. 16 is a circuit diagram of a band pass filter that is a modification of the first preferred embodiment of the present invention.

A modification of the first preferred embodiment is illustrated in FIG. 16, a duplexer 41 does not necessarily have to include a series arm resonator. The first parallel arm resonator P1 and the second parallel arm resonator P2 in a first band pass filter 41a are band elimination filters. Also in this case, the steepness on a lower-frequency side of a passband of the first band pass filter 41a is increased and the amount of attenuation outside the passband of the first band pass filter 41a is increased.

In the first preferred embodiment, the fourth ground terminal 5d of the second band pass filter 1b is not connected to the first ground terminal 5a, the second ground terminal 5b, or the third ground terminal 5c of the first band pass filter 1a on the piezoelectric substrate 2. The isolation characteristics of the duplexer 1 are therefore improved.

The piezoelectric substrate 2 according to the first preferred embodiment has a rectangular or substantially rectangular plate shape. The receiving terminal 4 of the first band pass filter 1a is provided near the corner portion of the piezoelectric substrate 2. Near another corner portion, the transmission terminal 14 of the second band pass filter 1b is provided. Thus, since the distance between the receiving terminal 4 and the transmission terminal 14 is long, the isolation characteristics of the duplexer 1 are effectively improved.

Figure 17:
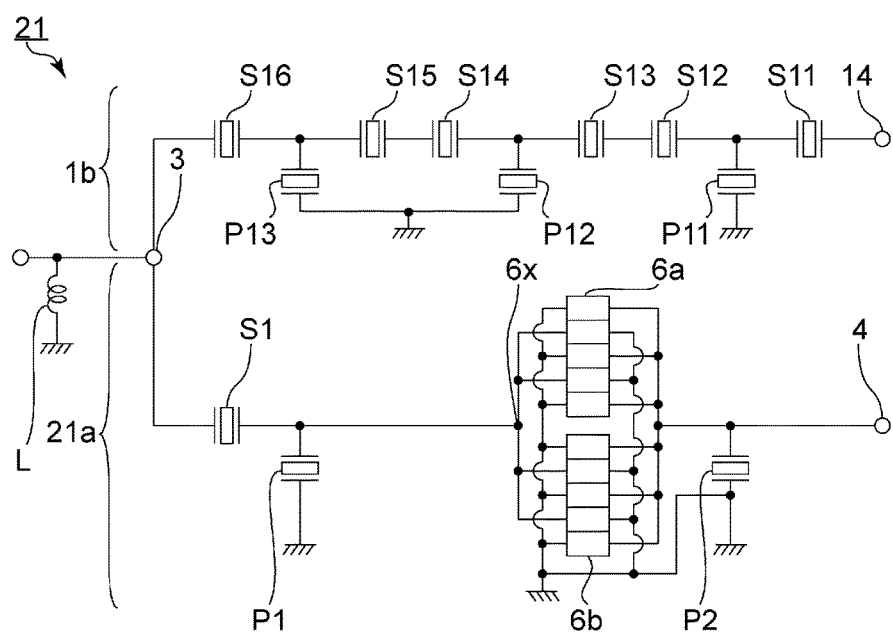
FIG. 17 is a circuit diagram of a duplexer according to a second preferred embodiment of the present invention.

FIG. 17 is a circuit diagram of a duplexer according to a second preferred embodiment of the present invention.

A duplexer 21 differs from a duplexer according to the first preferred embodiment in that there is no series arm resonator between the first parallel arm resonator P1 and each of the first longitudinally coupled resonator elastic wave filter 6a and the second longitudinally coupled resonator elastic wave filter 6b in a first band pass filter 21a. In addition, the duplexer 21 differs from a duplexer according to the first preferred embodiment in that the second parallel arm resonator P2 is provided between the receiving terminal 4 and each of the first longitudinally coupled resonator elastic wave filter 6a and the second longitudinally coupled resonator elastic wave filter 6b. Except for the above-described points, the configuration of the duplexer 21 preferably is the same or substantially the same as that of the duplexer 1 according to the first preferred embodiment.

Like in the first preferred embodiment, in this preferred embodiment, the steepness on a lower-frequency side of a passband of the first band pass filter 21a in the duplexer 21 is increased and the amount of attenuation outside the passband of the first band pass filter 21a is increased. In addition, the isolation characteristics of the duplexer 21 are improved.

In this preferred embodiment, the first parallel arm resonator P1 is connected between the antenna terminal 3 and a ground potential and the second parallel arm resonator P2 is connected between the receiving terminal 4 and a ground potential. The first longitudinally coupled resonator elastic wave filter 6a and the second longitudinally coupled resonator elastic wave filter 6b are located between the first parallel arm resonator P1 and the second parallel arm resonator P2. It is therefore possible to further increase the amount of attenuation outside the passband of the first band pass filter 21a.

The first parallel arm resonator P1 may be located between the receiving terminal 4 and each of the first longitudinally coupled resonator elastic wave filter 6a and the second longitudinally coupled resonator elastic wave filter 6b, and the second parallel arm resonator P2 may be located between the antenna terminal 3 and each of the first longitudinally coupled resonator elastic wave filter 6a and the second longitudinally coupled resonator elastic wave filter 6b.

Figure 18:
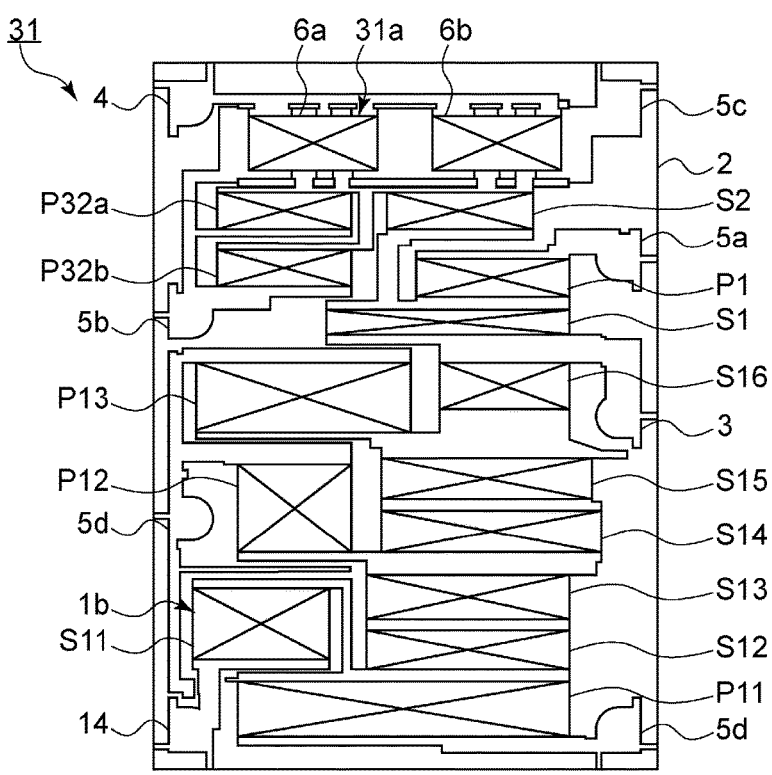
FIG. 18 is a schematic plan view illustrating an electrode structure of a duplexer according to a third preferred embodiment of the present invention.
Figure 19:
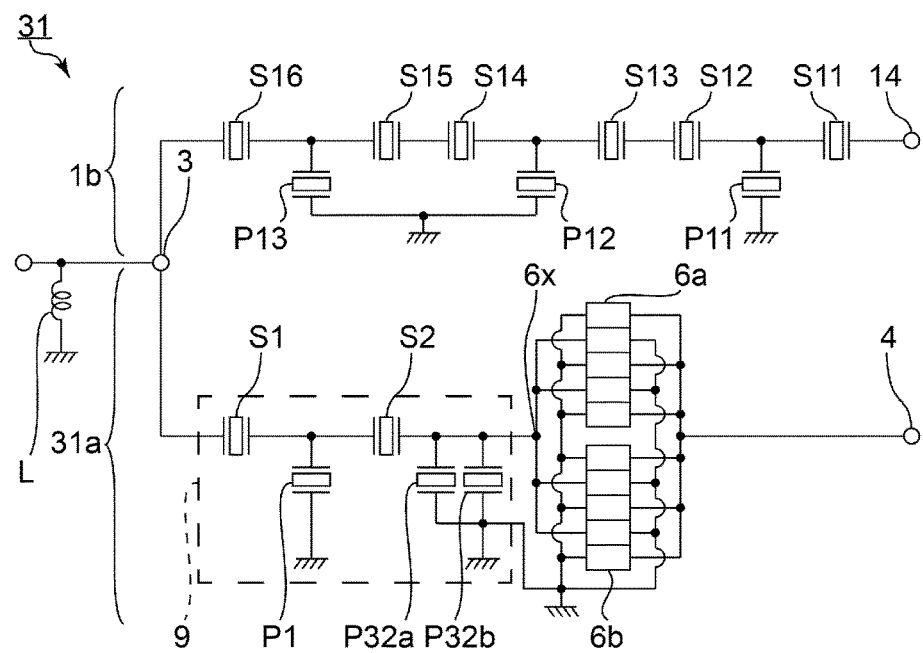
FIG. 19 is a circuit diagram of a duplexer according to the third preferred embodiment of the present invention.

FIG. 18 is a schematic plan view illustrating an electrode structure of a duplexer according to a third preferred embodiment of the present invention. FIG. 19 is a circuit diagram of a duplexer according to the third preferred embodiment.

A duplexer 31 differs from a duplexer according to the first preferred embodiment in that a first band pass filter 31a includes a plurality of second parallel arm resonators according to the first preferred embodiment. Except for the above-described point, the configuration of the duplexer 31 is the same as that of the duplexer 1 according to the first preferred embodiment.

A parallel arm resonator is divided in a parallel manner into a plurality of second parallel arm resonators, i.e., a plurality of divided parallel arm resonators P32a and P32b, which are connected between the second ground terminal 5b and each of the first longitudinally coupled resonator elastic wave filter 6a and the second longitudinally coupled resonator elastic wave filter 6b. As illustrated in FIG. 19, the divided parallel arm resonators P32a and P32b are connected in parallel to each other between a connection point that is located between the series arm resonator S2 and the connection point 6x and a ground potential.

The divided parallel arm resonator P32a has the resonance frequency of about 911 MHz and the capacitance of about 2.53 pF. The divided parallel arm resonator P32b has the resonance frequency of about 909.5 MHz and the capacitance of about 2.53 pF. Accordingly, the resonance frequencies of the divided parallel arm resonators P32a and P32b are lower than that of the first parallel arm resonator P1, and the capacitances of the divided parallel arm resonators P32a and P32b are larger than that of the first parallel arm resonator P1.

Figure 20:
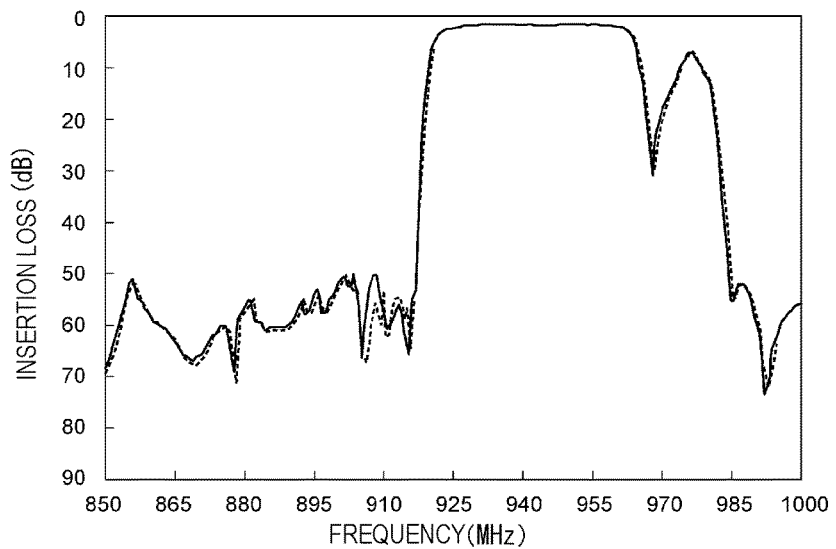
FIG. 20 is a diagram illustrating attenuation frequency characteristics of a first band pass filter according to the first preferred embodiment of the present invention and a first band pass filter according to the third preferred embodiment of the present invention.
Figure 21:
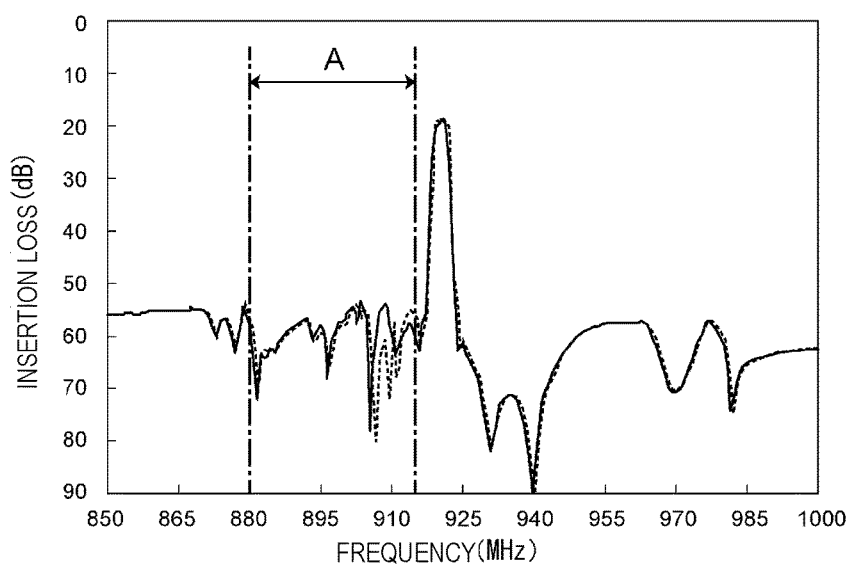
FIG. 21 is a diagram illustrating isolation characteristics of a duplexer according to the first preferred embodiment of the present invention and a duplexer according to the third preferred embodiment of the present invention.

FIG. 20 is a diagram illustrating attenuation frequency characteristics of a first band pass filter according to the first preferred embodiment and a first band pass filter according to the third preferred embodiment. FIG. 21 is a diagram illustrating isolation characteristics of a duplexer according to the first preferred embodiment and a duplexer according to the third preferred embodiment. In FIGS. 20 and 21, a solid line represents a result of the first preferred embodiment and a broken line represents a result of the third preferred embodiment.

As illustrated in FIG. 20, like in the first preferred embodiment, in this preferred embodiment, it is possible to increase the steepness on a lower-frequency side of a passband of the first band pass filter.

As illustrated in FIG. 21, in this preferred embodiment, it is possible to further improve the isolation characteristics of a duplexer as compared with the first preferred embodiment. As illustrated in FIG. 18, the duplexer 31 includes the divided parallel arm resonators P32a and P32b having different resonance frequencies. It is therefore possible to improve the isolation characteristics of the duplexer 31 in a wide frequency range.

Although there are two divided parallel arm resonators P32a and P32b in this preferred embodiment, the first band pass filter 31a may include more than two parallel arm resonators. In this case, it is desirable that the resonance frequency of at least one of the parallel arm resonators be different from that of one of the other parallel arm resonators to improve the isolation characteristics of the duplexer 31 in a wide frequency range.

The first band pass filter 31a effectively increases the amount of attenuation outside a passband even in a case where the first band pass filter 31a is not used in a duplexer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A band pass filter comprising:
   a piezoelectric substrate;
   a first terminal provided on the piezoelectric substrate;
   a second terminal provided on the piezoelectric substrate;
   a longitudinally coupled resonator elastic wave filter that is connected to the first terminal and is provided on the piezoelectric substrate;
   a plurality of ground terminals that are provided on the piezoelectric substrate and are connected to a ground potential; and
   a plurality of parallel arm resonators provided at a plurality of parallel arms each connected between a series arm connecting the first terminal and the second terminal and one of the ground terminals; wherein
   the parallel arm resonators include a first parallel arm resonator having a highest resonance frequency among the parallel arm resonators and a second parallel arm resonator other than the first parallel arm resonator;
   the ground terminals include a first ground terminal connected to the first parallel arm resonator, a second ground terminal connected to the second parallel arm resonator, and a third ground terminal connected to the longitudinally coupled resonator elastic wave filter; and
   the second ground terminal and the third ground terminal are connected to each other on the piezoelectric substrate, and the first ground terminal is not connected to the second ground terminal or the third ground terminal on the piezoelectric substrate.

2. The band pass filter according to claim 1, further comprising a series arm resonator that is provided at the series arm and is connected between the longitudinally coupled resonator elastic wave filter and one of the first terminal and the second terminal.

3. The band pass filter according to claim 2, wherein
   the series arm resonator is provided between the first parallel arm resonator and the second parallel arm resonator; and
   the first parallel arm resonator, the second parallel arm resonator, and the series arm resonator define a ladder filter.

4. The band pass filter according to claim 1, wherein
   one of the first parallel arm resonator and the second parallel arm resonator is connected between the first terminal and one of the ground terminals, and
   the other one of the first parallel arm resonator and the second parallel arm resonator is connected between the second terminal and one of the ground terminals.

5. The band pass filter according to claim 1, wherein a capacitance of the first parallel arm resonator is smaller than a capacitance of the second parallel arm resonator.

6. The band pass filter according to claim 1, wherein the second parallel arm resonator is one of a plurality of second parallel arm resonators.

7. The band pass filter according to claim 6, wherein the plurality of second parallel arm resonators includes a plurality of divided parallel arm resonators, and
   a resonance frequency of at least one of the divided parallel arm resonators is different from that of one of the other divided parallel arm resonators.

8. The band pass filter according to claim 1, wherein the second parallel arm resonator is provided between the second terminal and the longitudinally coupled resonator elastic wave filter.

9. The band pass filter according to claim 1, wherein the longitudinally coupled resonator elastic wave filter is between the first parallel arm resonator and the second parallel arm resonator.

10. The band pass filter according to claim 1, wherein
    the longitudinally coupled resonator elastic wave filter is a first longitudinally coupled resonator elastic wave filter and a second longitudinally coupled resonator elastic wave filter connected in parallel; and
    the second parallel arm resonator is provided between the second terminal and each of the first longitudinally coupled resonator elastic wave filter and the second longitudinally coupled resonator elastic wave filter.

11. A duplexer comprising:
    a first band pass filter that is a band pass filter according to claim 1; and
    a second band pass filter that is provided on the piezoelectric substrate and has a passband different from a passband of the first band pass filter.

12. The duplexer according to claim 11, further comprising a fourth ground terminal that is connected to the second band pass filter and a ground potential, and that is not connected to the first ground terminal, the second ground terminal, or the third ground terminal on the piezoelectric substrate.

13. The duplexer according to claim 11, wherein the first band pass filter is a reception filter and the second band pass filter is a transmission filter.

14. The duplexer according to claim 11, further comprising a series arm resonator that is provided at the series arm and is connected between the longitudinally coupled resonator elastic wave filter and one of the first terminal and the second terminal.

15. The duplexer according to claim 14, wherein
    the series arm resonator is provided between the first parallel arm resonator and the second parallel arm resonator; and
    the first parallel arm resonator, the second parallel arm resonator, and the series arm resonator define a ladder filter.

16. The duplexer according to claim 11, wherein
    one of the first parallel arm resonator and the second parallel arm resonator is connected between the first terminal and one of the ground terminals, and
    the other one of the first parallel arm resonator and the second parallel arm resonator is connected between the second terminal and one of the ground terminals.

17. The duplexer according to claim 11, wherein a capacitance of the first parallel arm resonator is smaller than a capacitance of the second parallel arm resonator.

18. The duplexer according to claim 11, wherein the second parallel arm resonator is one of a plurality of second parallel arm resonators.

19. The duplexer according to claim 18, wherein
the plurality of second parallel arm resonators includes a plurality of divided parallel arm resonators; and
a resonance frequency of at least one of the divided parallel arm resonators is different from that of one of the other divided parallel arm resonators.

20. The duplexer according to claim 11, wherein the second parallel arm resonator is provided between the second terminal and the longitudinally coupled resonator elastic wave filter.

* * * * *